United States Patent
Voisine

(10) Patent No.: US 10,830,801 B2
(45) Date of Patent: Nov. 10, 2020

(54) VA METERING IN DELTA-WIRED ELECTRICAL SERVICE

(71) Applicant: Landis+Gyr Innovations, Inc., Alpharetta, GA (US)

(72) Inventor: John T. Voisine, Lafayette, IN (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 370 days.

(21) Appl. No.: 15/886,642

(22) Filed: Feb. 1, 2018

(65) Prior Publication Data

US 2018/0224486 A1   Aug. 9, 2018

Related U.S. Application Data

(60) Provisional application No. 62/453,403, filed on Feb. 1, 2017.

(51) Int. Cl.
  *G01R 21/133* (2006.01)
  *H01F 38/14* (2006.01)
  (Continued)

(52) U.S. Cl.
  CPC ......... *G01R 21/1331* (2013.01); *H01F 38/14* (2013.01); *H01F 38/34* (2013.01); *H02B 1/03* (2013.01); *G01R 21/06* (2013.01)

(58) Field of Classification Search
  CPC ..... G01R 21/1331; G01R 21/06; H01F 38/14; H01F 38/34; H02B 1/03
  See application file for complete search history.

(56) References Cited

U.S. PATENT DOCUMENTS 5,652,505 A  7/1997  Brune
6,778,920 B1  8/2004  Balch et al.
(Continued)

FOREIGN PATENT DOCUMENTS

JP  S6443766 A  2/1989
JP  H07-120510 A  5/1995
(Continued)

OTHER PUBLICATIONS

Vicente León-Martinez et al., "Four-Wire Delta Service Sinusoidal Operation and Compensation Simulator", Energies 2015, 8, 11276-11294 (Year: 2015).*

*Primary Examiner* — Regis J Betsch
(74) *Attorney, Agent, or Firm* — Kilpatrick Townsend & Stockton LLP

(57) ABSTRACT

An arrangement includes an A/D converter and a processing circuit. The A/D converter is configured to generate digital samples of voltage and current waveforms in a polyphase electrical system. The processing circuit is operably coupled to receive the digital samples from the A/D converter. The processing circuit configured is to obtain contemporaneous phase current and voltage samples $I_A$, $I_B$, $I_C$ and/or $I_N$, and $V_A$, $V_B$, $V_C$. The processing circuit is further configured to determine source leg current sample values based on three of the current samples of $I_A$, $I_B$, $I_C$, and $I_N$, and also based on a ratio of the impedance on one leg of a center-tapped source transformer secondary winding to another secondary winding of a source transformer. The processing circuit is further configured to determine a VA value based at least in part on the source leg current samples. The processing circuit is further configured to provide information representative of the VA calculation to one of a group consisting of a display, a communication circuit, a memory and a billing calculation unit.

18 Claims, 5 Drawing Sheets

(51) Int. Cl.
*H02B 1/03* (2006.01)
*H01F 38/34* (2006.01)
*G01R 21/06* (2006.01)

(56) References Cited

U.S. PATENT DOCUMENTS

| | | |
|---|---|---|
| 7,747,400 B2 | 6/2010 | Voisine |
| 8,731,854 B2 | 5/2014 | Martin |
| 9,261,544 B2 | 2/2016 | Mondot |
| 2002/0186000 A1* | 12/2002 | Briese ................... G01R 35/04 324/142 |
| 2004/0232904 A1 | 11/2004 | Gandhi |
| 2007/0115022 A1 | 5/2007 | Hemminger et al. |
| 2010/0052962 A1 | 3/2010 | Rzehak |
| 2012/0078546 A1* | 3/2012 | Mancuso ............. G01R 19/155 702/61 |
| 2013/0046663 A1 | 2/2013 | Antonesei et al. |
| 2017/0292999 A1* | 10/2017 | Turner ............... G01R 19/2513 |

FOREIGN PATENT DOCUMENTS

| | | |
|---|---|---|
| JP | H11-344514 A | 12/1999 |
| JP | 2011-169619 A | 9/2011 |
| WO | 2002/027334 A1 | 4/2002 |

* cited by examiner

VA METERING IN DELTA-WIRED ELECTRICAL SERVICE

This application claims the benefit of U.S. Provisional Patent Application Ser. No. 62/453,403, filed Feb. 1, 2017, the entirety of which is incorporated herein by reference.

FIELD OF THE INVENTION

The present invention relates generally to electricity measurements, and more particularly, to apparent power (VA) and apparent energy (VAh) measurements.

BACKGROUND

One of the goals of electricity metering is to accurately measure the use or consumption of electrical energy resources. With such measurements, the cost of generating and delivering electricity may be allocated among consumers a in relatively logical manner. Another goal of electricity metering is to help identify electrical energy generation and delivery needs. For example, cumulative electricity consumption measurements for a service area can help determine the appropriate sizing of transformers and other equipment.

One particular activity that involves equipment allocation is the sizing of transformers for delta-wired electrical systems. Many delta-wired transformer systems employ a delta-wired transformer or set transformers to deliver power to a customer. For example, in rural agrarian environments, it is common to provide a three-phase transformer at each customer premise. One of the phases may be used to provide electricity in the house for domestic purposes, while three-phase power is provided to farming equipment, for example, milking machines in a barn. The customer is ultimately billed based on real energy usage (e.g. kilowatt-hours).

The transformer for each such customer is often sized based on anticipated or known usage. The utility (or customer) attempts to employ a transformer that is properly rated for the anticipated usage. In particular, each transformer has a rating, called a VA-rating, related to the number of amps that it can carry without significant strain. If a transformer is continuously strained due to overcurrent, the transformer can degrade and eventually fail. The interruption of power resulting from a transformer failure can lead to unpredictable, expensive service calls. Conversely, because higher rated transformers require more expensive components, it is not advantageous to employ a transformer having too high of a VA-rating. Accordingly, it can be advantageous to monitor current flowing through the transformers, to determine whether they have been improperly sized.

As discussed above, electricity meters are primarily installed to measure energy consumption. Thus, one measure related to current flowing through the transformer for a particular customer is from the real energy consumption data. However, transformers have VA-ratings because the strain on the transformer(s) relates more to the apparent power or energy (VA or VA-hours) delivered to the customer. In a case of a customer that consumes significantly more VA than watts, the metering of only real energy will not accurately identify the strain placed on the power delivery equipment. As a consequence, many electricity meters, particularly for larger loads (e.g. agricultural, business, or industrial loads), have at least some capability to measure VA or VA-hours.

To this end, meters can calculate VA using the RMS values of the individual phase voltages and currents for each of a polyphase system. In other words, the VA of each phase is determined using $VA=V_{RMS}*I_{RMS}$ and then the total VA is calculated by simply adding the individual VA of each phase. This method of calculating VA is sometimes referred to as "RMS VA" ($VA_{RMS}$) or "arithmetic VA". Arithmetic VA is identified as being most accurate with respect to the source or service side of the electrical system, and not the load side. Thus, this calculation is most relevant to identifying the strain on the transformer associated with the customer, which is essentially, the source.

In another method, the VA is calculated using watts and VAR (i.e. reactive power). In this method, the total amount of watts for all three phases is determined, and the amount of VAR for all three phases is determined. The total VA is then calculated using the formula $VA=\sqrt{Watt^2+VAR^2}$ where Watt and VAR represent the total load watt and VAR respectively. This method of calculating VA is sometimes referred to as "vector VA" ($VA_V$). Vector VA is considered to be more accurate with the load side of the electrical system.

Further detail regarding the calculation of arithmetic or source VA and the calculation of vector or load VA for many types of electrical service is provided in U.S. Pat. No. 7,747,400, which is incorporated herein by reference in its entirety. In U.S. Pat. No. 7,747,400, a meter is disclosed that includes various methods of calculating that can be selected by a technician. While the meter disclosed in U.S. Pat. No. 7,747,400 provides many useful metered VA values, it does not provide a source or arithmetic VA calculation for four-wire delta electrical services.

However, U.S. Pat. No. 9,261,544 discloses a method of calculating source VA that is applicable to delta-wired electrical service. The method described in that patent is most accurate when the loads are balanced in all three legs of the source transformer. In particular, the utility transformer in a delta-wired electrical service includes three legs, including three secondary windings that are wired together in delta format. By way of example, the transformer arrangement 28 of FIG. 1 illustrates a common delta-wired transformer having three legs. U.S. Pat. No. 9,261,544 identifies a method for determining source VA for such a transformer, presuming that the load is balanced across all three phases. Such an assumption is not always justified.

For example, in the case of a delta-wired service in an agricultural facility, one of the phases may be used for domestic power in a residence, while all three phases are used in the machinery and equipment areas of the facility. Thus, the phase loading can be unbalanced, due to one the three phases being used for additional purposes. As a consequence, it is known to employ a delta-service transformer that has one leg that has a higher VA rating. A higher VA rated leg will have lower overall impedance, and larger and more expensive components.

There is a need to determine source VA in facilities having delta-wired electrical service in which an unbalanced load is possible. One solution would be to actually measure the arithmetic VA on the transformer itself. More specifically, the voltage and current on each of three secondary windings of the delta service transformer may be measured, and VA calculated using the arithmetic VA methods discussed further above. However, such measurements cannot be performed in a customer utility meter. The delta service transformer and utility meter are not necessarily co-located, and electricity meters do not have sensors configured to measure the current on the secondary windings of delta service transformers.

A particular need is for a method of measuring VA that accurately estimates or represents the VA at the source, which can provide better information for the sizing of transformers and other equipment, and which may be carried out using sensor and metrology circuits within a three-phase utility meter.

SUMMARY OF THE INVENTION

A first aspect of the invention is a meter that is operable to implement an appropriate VA calculation within an electricity meter in a four-wire service based on values normally measurable and available within the meter.

A first embodiment is an arrangement for measuring VA loading on a transformer in a delta-wired electrical service. The arrangement includes a meter housing, a sensor circuit, a processing circuit, and an A/D converter. The sensor circuit is disposed within the meter housing and is configured to receive voltage and current provided to a load from one or more source transformers arranged in a delta-wired electrical service having phase A, phase B, and phase C lines. The one or more transformers including at least one center-tap secondary winding. The sensor circuit is configured to generate voltage measurement signals and current measurement signals representative of the received voltage and current. The A/D converter is disposed within the meter housing, and is configured to receive the voltage measurement signals and generate therefrom contemporaneous samples of $V_A$, $V_B$, $V_C$, and to receive the current measurement signals and generate therefrom at least three of $I_A$, $I_B$, $I_C$, and $I_N$. $I_A$ is a current measurement signal of phase A, $I_B$ is a current measurement signal of phase B, $I_C$ is a current measurement signal of phase C, $I_N$ is a current measurement signal of a neutral connection, $V_A$ is a voltage measurement signal from phase A to neutral, $V_B$ is a voltage measurement signal from phase B to neutral, and $V_C$ is a voltage measurement signal from phase C to neutral.

The processing circuit is operably coupled to the A/D converter, and is configured to:

i) obtain a value indicative of a ratio K of the first impedance to the second impedance;

ii) determine an $I_{BC}$ sample value based on K and contemporaneous samples of at least three of $I_A$, $I_B$, $I_C$, and $I_N$;

iii) determine an $I_{CA}$ sample value based on K and contemporaneous samples of at least three of $I_A$, $I_B$, $I_C$, and $I_N$;

iv) determine an $I_{NB}$ sample value based on K and contemporaneous samples of at least three of $I_A$, $I_B$, $I_C$, and $I_N$;

v) determine an $I_{AN}$ sample value based on K and contemporaneous samples of at least three of $I_A$, $I_B$, $I_C$, and $I_N$;

vi) determine a VA value corresponding to the at least one transformer based at least in part on $I_{BC}$, $I_{CA}$, $I_{NB}$ and $I_{AN}$; and vii) provide information representative of the VA value to one of a group consisting of a display, a communication circuit, a memory and a billing calculation unit.

The arrangement provides, among other things a more accurate VA value indicative of the arithmetic or source VA on the source transformer in a four wire delta system without requiring direct sensing of the source transformer windings.

The above described features and advantages, as well as others, will become more readily apparent to those of ordinary skill in the art by reference to the following detailed description and accompanying drawings.

DETAILED DESCRIPTION

Figure 1:
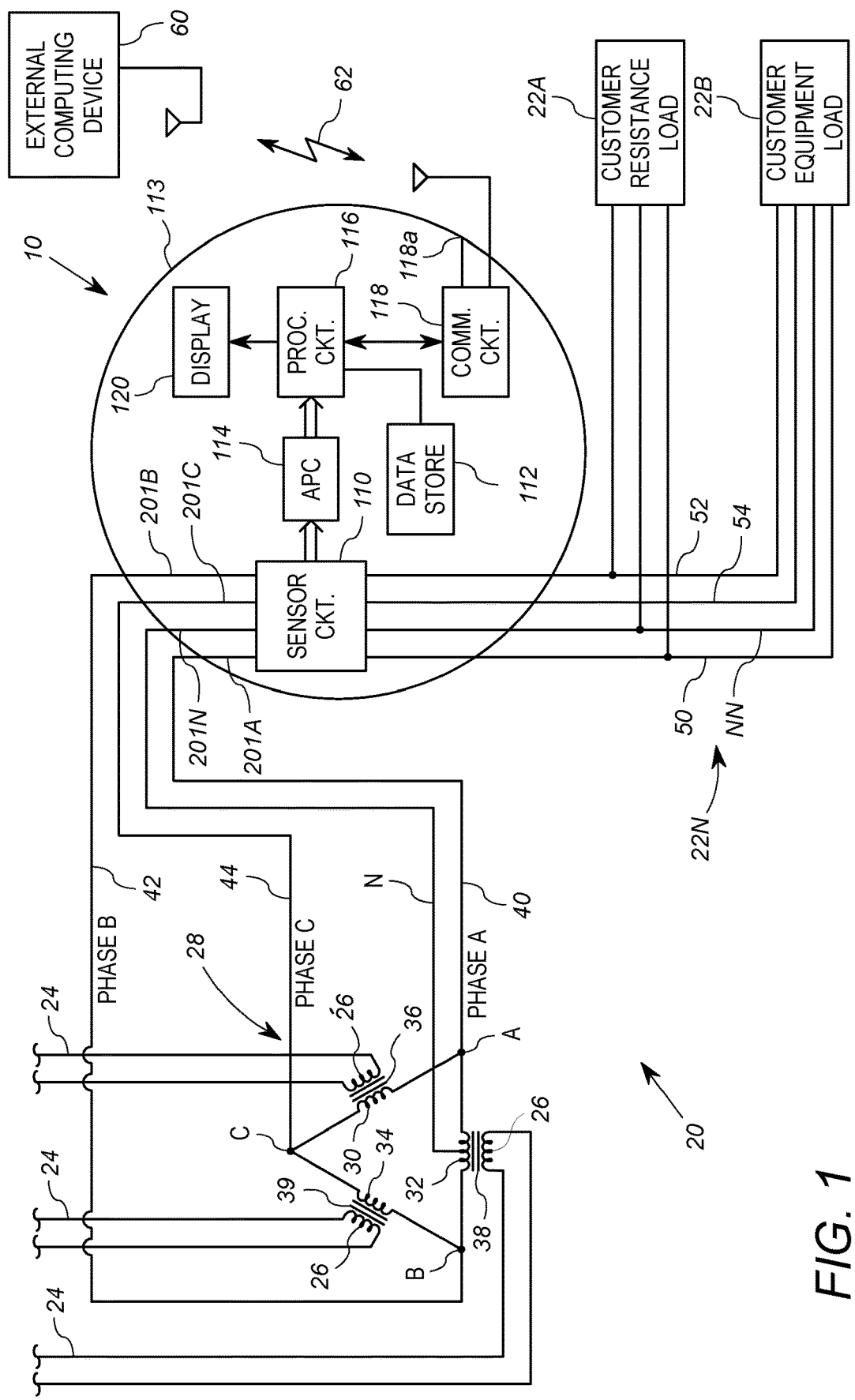
FIG. 1 shows a schematic diagram of an exemplary meter according to one or more embodiments of the present invention, implemented in an exemplary electrical system.

FIG. 1 shows a schematic diagram of an exemplary embodiment of a polyphase electricity meter 10 in an exemplary electrical system 20 wherein three phase power is provided to a customer load 22. In particular, utility power lines 24 provide three phase power to three primary windings 26 of a delta wired transformer arrangement 28. The delta wired transformer arrangement includes three primary windings 26, three secondary windings 30, 32 and 34, and three cores 36, 38, and 39. The secondary windings 30, 32 have end terminals connected at node A, the secondary windings 32, 34 have end terminals connected at node B, and the secondary windings 34, 30 have end terminals connected at node C, such that secondary winding 30 is connected between nodes A and C, secondary winding 32 is connected between nodes A and B, and secondary winding 34 is connected between nodes B and C.

Each of the legs of the transformer arrangement 28 has a VA rating that is known, and may be suitably printed on a plate attached directly or indirectly to the transformer arrangement 28, or its housing(s), not shown. In this embodiment, the rating of the leg of the transformer arrangement 28 including the secondary winding 30 (leg AC) may suitably be R_VA, and the rating of the leg of the transformer 28 with the secondary winding 34 (leg BC) would also be R_VA. However, the rating of the leg of the transformer arrangement 28 with the secondary winding 32 (leg AB) may be A*(R_VA), where A>1. The VA rating of the AB leg is thus higher than that of the other two legs by a factor of A−1. The VA rating of the AB leg is higher because the secondary winding 32 is coupled to provide more power to the customer load 22.

The transformer arrangement 28 provides power to the load 22 through the meter 10. To this end, a phase A power line 40 is coupled from node A to the load 22 via the meter 10, a phase B power line 42 is coupled from node B to the load 22 via the meter 10, and a phase C power line 44 is coupled from node C to the load 22 via the meter 10. A neutral line N is coupled from a center tap connection on the secondary winding 32 to the load 22 via the meter 10. Specifically, power is provided to the load from the delta wired transformer arrangement 28 to the meter 10 on phase A, phase B, and phase C power lines 40, 42 and 44, respectively, with reference to a neutral line N. As will be discussed below in detail the meter 10 is operably coupled to connect the power lines 40, 42, 44 and N to corresponding distribution lines 50, 52, 54 and NN of the load 22.

The load 22 in this exemplary embodiment includes a residence load 22A and an equipment load 22B. The residence load 22A may suitably be the electrical system of a house or other residence. To this end, the phase A, phase B and neutral distribution lines 50, 52 and NN are coupled to the residence load 22A. In this example, the phase A to phase B voltage ($V_{AB}$) is 240 VAC. The voltages from either phase to neutral, $V_{AN}$ and $V_{NB}$ is 120 VAC, which is sufficient for most household loads. Of course, 240 VAC is also available for larger domestic devices, via lines 50, 52. In contrast to the residence load 22A, the equipment load 22B is predominantly higher power consuming equipment, such as electrical farm equipment, which may be located in a separate building, or otherwise remote from the residence. All of the distribution lines 50, 52, 54 and NN are coupled to provide three-phase power to the equipment load 22B.

In this example, the provision of only phase A and phase B to the residence load 22A can create an imbalance on the secondary windings 30, 32, 34 because only the secondary winding 32 is powering the residence load 22A. Because of this configuration, the utility configures the transformer arrangement 28 such that the AB leg (with secondary winding 32) of the transformer arrangement 28 has a higher VA rating than the BC and AC legs of the transformer.

The meter 10 is an apparatus for measuring real energy consumption by the load 22, and in this embodiment, to measure the VA (apparent energy) on each of the windings 30, 32 and 34 of the source transformer arrangement 28. The meter 10 measures real energy consumption, among other things, for the billing and other purposes. The meter 10 measures the VA on the windings 30, 32 and 34 in part to provide the utility service provider with information relating to the strain on the delta wired transformer arrangement 28.

The meter 10 includes a sensor circuit 110, an analog-to-digital conversion ("ADC") circuit 114, a processing circuit 116, a communication circuit 118, an optional display 120 and a data store 112. All of the above listed elements are preferably supported by a meter housing 113, which may take a plurality of known forms, and is configured to protect the other components of the meter 10 from the environment and from tampering. The communication circuit 118 may be disposed within an interior of the meter housing 113 like the other devices, or may be affixed to the outside of the meter housing 113.

In the embodiment described herein, the sensor circuit 110 includes conductors (e.g. coils or busbars) 201A, 201B, 201C and 201N that couple, respectively, the power lines 40, 42, 44 and N to the respective distribution lines 50, 52, 54 and NN. The conductors 201A, 201B, 201C and 201N are supported by the meter housing 113 and include a portion that is within the meter housing 113. The sensor circuit 110 includes additional circuitry, known in the art, configured to provide analog voltage and current measurement signals representative of the respective voltage and current waveforms on all conductors 201A, 201B, 201C and 201N. For example, the sensor circuit 110 may suitably comprise current and voltage sensors, not shown. The voltage sensors, which may, for example, include voltage dividers, generate a scaled down version of the voltage present on the conductors 201A, 201B and 201C with respect to neutral 201N. The current sensors, which may suitably include current transformers, shunts, embedded coil devices and the like, generate a voltage or current signal that is a scaled down version of the current present on at least three of the conductors 201A, 201B and 201C with respect to neutral 201N. The sensor circuit 110 is operably coupled to provide the analog voltage and current measurement signals to the ADC circuit 114.

The ADC circuit 114 is a sampling analog to digital converter that is configured to use the received measurement signals and generate digital signals representative of line voltage waveforms $V_A$, $V_B$, $V_C$ for each of three phases A, B, C of a four-wire delta electrical system and other digital signals representative of at least three of the four line current waveforms $I_A$, $I_B$, $I_C$ and $I_N$ of the four-wire delta electrical system. As will be discussed below, however, the meter 10 may readily be configured for a three-wire delta electrical service, as well as other types of electrical service. The digital signals are typically sequences of digital samples representative of an instantaneous voltage or current measurement on one phase with respect to either neutral or another phase. Circuits capable of generating such signals are known in the art. Suitable examples of analog to digital conversion circuits having such capabilities are described in U.S. Pat. No. 6,374,188; U.S. Pat. No. 6,564,159; U.S. Pat. No. 6,121,158 and U.S. Pat. No. 5,933,004, all of which are incorporated herein by reference. Moreover, the ADC circuit 114 may readily be a part of an integrated metering chip package, as will be discussed below.

The processing circuit 116 is configured to calculate one or more energy consumption values based on the digital signals, including real energy consumption values. The energy consumption values may be communicated to a remote device using the communication circuit 118, displayed using the display 120, stored in the data store 112, or preferably some combination of the foregoing. In accordance with the embodiments described herein, the processing circuit 116 is further operable to perform any or all of the VA calculations described herein, which identifies the source VA, or VA of the secondary windings 30, 32 and 34.

The processing circuit 116 is a device that employs one or more processing devices such as microprocessors, microcontrollers, digital signal processors, discrete digital circuits and/or combinations thereof. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$\text{Whrs} = \Sigma V_n * I_n. \quad (3)$$

where Whrs is an accumulated energy value (i.e. watt-hours) for a time frame from a starting time $n_0$ to a time corresponding to n.

In addition, the processing circuit 116 preferably calculates VA and/or VAh using one or more of the methods described herein. Thus, the processing circuit 116 may generate VA, VAh, watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. No. 6,374,188; U.S. Pat. No. 6, 564,159; U.S. Pat. No. 6,121,158 and U.S. Pat. No. 5,933,004. However, in one preferred embodiment, the processing circuit is (or includes) a processing element of a metering integrated circuit chip such as the Teridian 71M6533 measurement chip (available from Silergy). In that embodiment, both the ADC circuit 114 and the processing circuit 116 are disposed within the same semiconductor package.

More specifically, the processing circuit 116 in one embodiment is configured (i.e. programmed and/or arranged) to generate a first VA calculation if configuration data identifies that a source VA calculation is selected, the first VA calculation providing a determination of a VA quantity that more accurately represents a source VA than a corresponding determination of a second VA calculation. The source VA in the example of FIG. 1 is the VA on the secondary windings 30, 32, 34 of the delta wired transformer arrangement 28. The processing circuit 116 is also configured to generate a second VA calculation if the configuration data identifies that load VA is selected, the second VA calculation providing a determination of a VA quantity that more accurately represents a load VA than a corresponding determination of the first VA calculation. The load VA represents to VA as delivered by the distribution lines 50, 52, 54 and NN. The configuration data identifying whether a source VA or load VA (or both) is/are to be calculated may suitably be stored in the data store 112 or other memory, or merely be stored in a buffer or register that receives user input or a communication input. The processing circuit 116 is further operable to provide the VA calculation to one of a group consisting of the display 120, the communication circuit 118, and a billing calculation unit within the processing circuit 116 or elsewhere.

To this end, the processing circuit 116 is configured to prompt the user to choose whether to calculate "source VA" and/or "load VA", or some other indication that VA is to be calculated from the perspective of the electricity source, and/or from the perspective of the load. The prompting may occur via interactive display using the display 120 and the communication circuit 118, or by other means. For example, the meter 10 may be configured using an external computing device 60, which may be located remotely, or may be coupled to communicate with the meter using an optical coupling, not shown. The external computing device 60 may be used to program configuration information (e.g. types of measurements to be taken, display features and/or calibration information) to a memory (i.e. data store 112). In addition, the external computing device 60 may be used to program into the data store 112 values representative of the VA ratings (or conversely, impedances), of the transformer leg AB (secondary winding 32), leg CA (secondary winding 30), and leg BC (secondary winding 34). As discussed above, the VA ratings associated with each of the legs CA and BC in this embodiment is R_VA, and the rating of the leg AB is A*(R_VA), where A>1. However, in other embodiments, the loads may be balanced and the VA ratings for all three legs AB, CA and BC are the same.

When the meter 10 is subsequently installed for use, the meter 10 performs a VA determination based on the stored configuration information of the user selection. If the user had selected source VA, then the processing circuit 116 automatically configures its metering operation to perform an arithmetic VA calculation. If, however, the user had selected load VA, then the processing circuit 116 automatically configures its metering operation to perform a vector VA calculation. It is possible that the meter 10 is configured to perform both calculations, and store the results as different values in the data store 112.

The processing circuit 116 is further operable to store the plurality of energy consumption values, including real energy consumption, in the data store 112. In some embodiments, the processing circuit 116 may store energy consumption values for each of plurality of time periods, in order to allow analysis of energy usage at different times of day, days of the week or month, or even seasonally. The storage of consumption indexed to time periods is often referred to in the industry as "load profiling".

The data store 112 may suitably be a random access memory, EEPROM, other memory, or a combination of several types of memory. In still other embodiments, the data store 112 may include a circular buffer, FIFO device, or other memory that stores data in the order in which it is received. Other suitable data store options may be used. In at least some embodiments, the data store 112 includes memory located within the integrated package that houses the processing circuit 116. The data store 112 also includes a software program that is executed by the processing circuit 116 to perform the operations of the processing circuit 116 described herein, including those of FIGS. 3A-3C.

The communication circuit 118 is a device that is in some embodiments configured to communicate data between the metering unit 12 and one or more remote devices, such as the external computer 60, using a communication network 62. In a system such as that shown in FIG. 1, the communication circuit 118 would be operable to communicate directly or indirectly with a data collection system of a utility service provider. Several of such systems are known. The utility service provider then uses the collected data to generate billing information and/or data forecasting information as is known in the art. To this end, the communication circuit 118 may suitably include a radio for communicating on a wireless communication network 62 with the external computing device 60. Radios may be used that operate in the 100 MHz to 2.5 GHz range. However, other devices may operate in the kHz or low MHZ range.

Alternatively, the communication network 62 may be a form of wired communication network, and the communication circuit 118 may include a telephone modem, a power line carrier modem, or other known communication device configured for use with utility meters. In addition or in the alternative, the communication circuit 118 is configured to communicate with a locally coupled device, such as a portable computing device, or other device. In such a case, the external computer 60 may be outfitted with complementary communicating equipment, and the network 62 would not be required. The communication circuit 118 may include an optical or electrical data port 118a for this purpose.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

As discussed above, the processing circuit 116 in one embodiment is configured to generate a selected one of a source VA value or a load VA value. This value may be used for billing purposes, for planning purposes and/or other analysis purposes. The VA value may be blended with other values, such as watt-hours or watts, or even reactive power.

As also discussed above, if a source VA is to be implemented, then the processing circuit 116 performs an arithmetic VA calculation. If a load VA is to be implemented, then the processing circuit 116 performs a vector VA calculation. As discussed above, as well as in U.S. Pat. No. 7,747,400, the vector VA is a fundamentally different calculation compared to arithmetic VA and sometimes yields different results. In general, the processing circuit 116 may be configured to determine vector or arithmetic VA for single phase, four-wire wye, and three- wire delta systems as discussed in the U.S. Pat. No. 7,747,400. Moreover, the processing circuit 116 may determine the vector VA or load VA as discussed further above and as is known in the prior art. The VA values may suitable be accumulated over time to provide VAh as is known.

However, in contrast to the prior art, at least some embodiments of the invention determine source VA (i.e. and/or VAh) as discussed below in connection with FIGS. 2 and 3A-3C.

Figure 2:
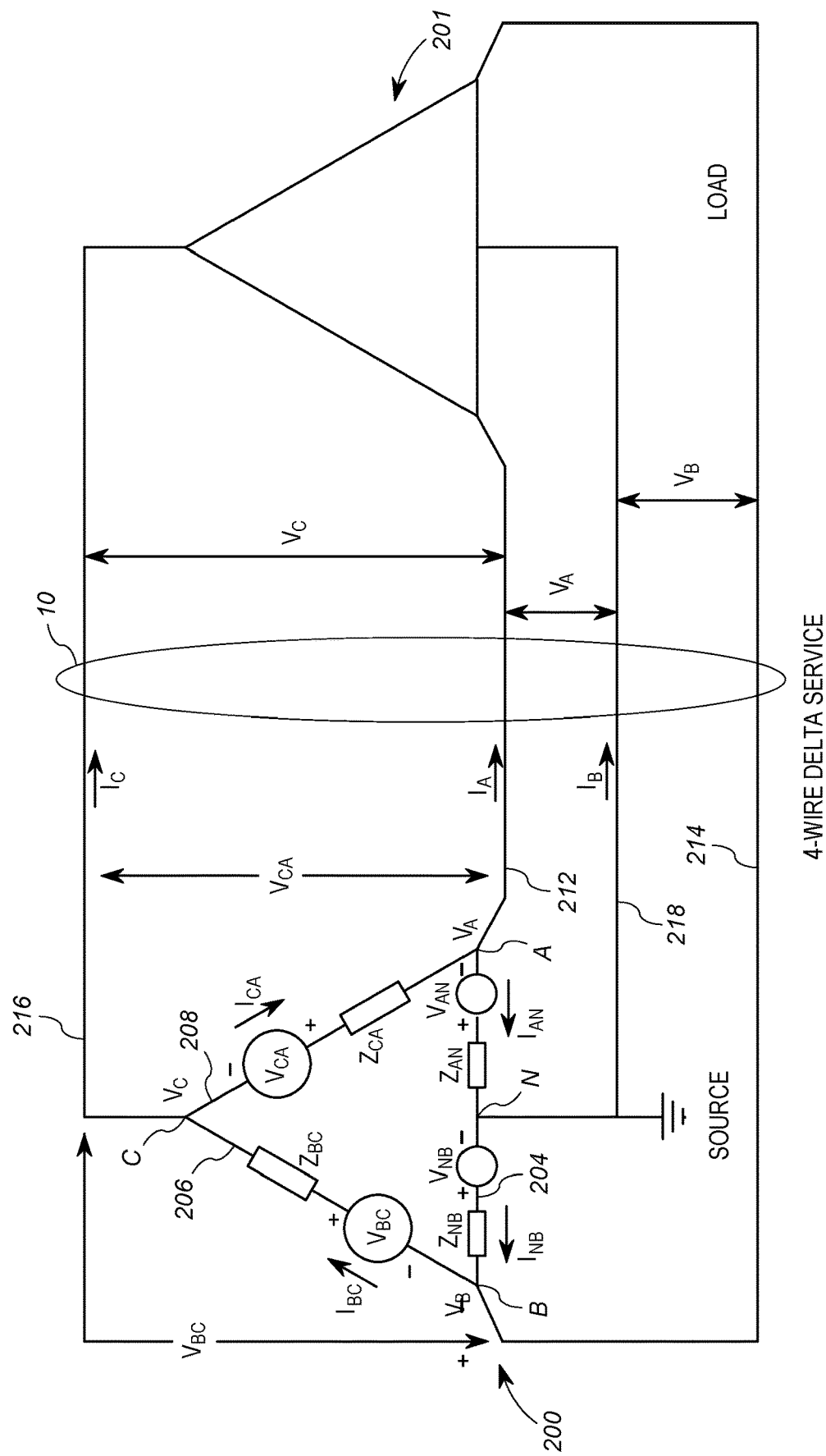
FIG. 2 shows a schematic diagram of the meter of FIG. 1 within a general measurement arrangement in which an embodiment of the invention may be employed.

FIG. 2 show a schematic representation of the more general case of the meter 10 coupled between a source 200 and a load 201 in a four-wire delta electrical service. The four-wire delta electrical source 200 includes a delta power source (transformer) as is known in the art. The source 200 includes three delta-wired secondary windings shown as an AB leg 204, a BC leg 206 and a CA leg 208. The transformer arrangement 28 of FIG. 1 is an example of the electrical source 200, with a corresponding AB leg 32, BC leg 34, and CA leg 30. The customer load 22 of FIG. 1 is an example of the load 201 of FIG. 2.

The electrical source 200 is operably coupled to provide three-phase delta-wired electrical service to the load 201 via a phase A line 212, a phase B line 214, a phase C line 216 and a neutral line 218 defined between the phase A line 212 and the phase B line 214. As discussed above in connection with FIG. 1, the meter 10 generally meters the energy (and related values) delivered to the load 201 from the source 200. The load 201 includes elements of a customer load, and may include resistive, inductive and/or capacitive loads. The load 201 may be balanced, or may be imbalanced, meaning that different loads may be connected from phase A to phase B, from phase B to phase C, from phase C to phase A, and/or additional loads may be connected from phase A to neutral, phase B to neutral and/or phase C to neutral.

In general, the meter 10 is operably connected to obtain the voltage measurements $V_A$, $V_B$, and $V_C$, and the current measurements $I_A$, $I_B$, $I_C$ and $I_N$. More specifically, referring to FIG. 1, the scaling unit 110 is operably coupled to generate voltage measurement signals $V_A$, $V_B$, $V_C$, $I_A$, $I_B$, $I_C$ and $I_N$, and provide those signals to the ADC circuit 114. In several embodiments described herein, only three of the four current values $I_A$, $I_B$, $I_C$ and $I_N$ need be digitized and stored. Typically $I_N$ is not digitized.

The signal $V_A$ represents a scaled version of the voltage from the phase A line 212 to neutral 218. The signal $V_B$ represents a scaled version of the voltage from the phase B line 214 to neutral 218, and the signal $V_C$ represents a scaled version of the voltage from the phase C line 216 to neutral 218. The signal $I_A$ represents a scaled version of the current on the phase A line 212, signal $I_B$ represents a scaled version of the current on the phase B line signal 214, and $I_C$ represents a scaled version of the current on the phase C line 216. The signal $I_N$ represents a scaled version of the current on the neutral line 218.

The ADC circuit 114, in turn, samples each of the waveforms $V_A$, $V_B$, $V_C$, $I_A$, $I_B$, $I_C$ and $I_N$, and generates corresponding digital sample streams $V_A(s)$, $V_B(s)$, $V_C(s)$, $I_A(s)$, $I_B(s)$, $I_C(s)$, and $I_N(s)$. The value s represents a sample index, which corresponds directly to a time increment. The sample rate s/sec is typically many times the cycle frequency of the AC waveform, such that the samples collectively provide an accurate sampled representation of the corresponding analog waveform. The operations of the scaling unit 110 and the ADC circuit 114 as discussed above are conventional.

The processing circuit 116 then calculates watt by multiplying the voltage samples of each phase with the current samples of each phase, and accumulating the resulting products. Using sampling, the processing circuit 116 may suitably perform the following calculations:

$$\text{Watt}_A = (\Sigma(V_A(s) * I_A(s)))/N \quad (1)$$

$$\text{Watt}_B = (\Sigma(V_B(s) * I_B(s)))/N \quad (2)$$

$$\text{Watt}_C = (\Sigma(V_C(s) * I_C(s)))/N \quad (3)$$

$$\text{Watt} = \text{Watt}_A + \text{Watt}_B + \text{Watt}_C \quad (4)$$

wherein $V_x(s)$ is the sampled voltage at a time s on phase x at the meter 10, and $I_x(s)$ is the sampled current at a time s on phase x at the meter 10. N is the number of samples over the period of time that the Watt value is measured. The value of Watt over a period is actually the average value of Watts over the measurement period. In the above equations, the term Watt is actually a power measurement in terms of watt.

The processing circuit 116 may suitably calculate vector (or load) VARs using the equation using 90 degree phase-delayed current measurements, as is known.

$$\text{VAR}_A = \Sigma(V_A(s) * I_A(s-90°))/N \quad (5)$$

$$\text{VAR}_B = \Sigma(V_B(s) * I_B(s-90°))/N \quad (6)$$

$$\text{VAR}_C = \Sigma(V_C(s) * I_C(s-90°))/N \quad (7)$$

$$\text{VAR} = \text{VAR}_A + \text{VAR}_B + \text{VAR}_C \quad (8)$$

N is the number of samples over the period of time that the VAR value is measured. The value of VAR over a period is actually the average value of VAR over the measurement period. With these two values Watt and VAR, the vector Vector_VA may be calculated as:

$$\text{Vector\_VA} = \sqrt{\text{Watt}^2 + \text{VAR}^2} \quad (9)$$

If instead, or in addition, arithmetic or source VA is to be calculated, then the processing circuit 116 calculates arithmetic VA using the following equation:

$$\text{SVA} = \text{VA} = |\vec{V}_{BC}| * |\vec{I}_{BC}| + |\vec{V}_{CA}| * |\vec{I}_{CA}| + |\vec{V}_B| * |\vec{I}_{NB}| + |\vec{V}_A| * |\vec{I}_{AN}| \quad (10)$$

wherein $\vec{V}_{CB}$ is a vector value of the voltage from phase C to phase B, $\vec{I}_{CB}$ is representative of the current from phase C to phase A at the source 200, $\vec{V}_{CA}$ is a vector value of the voltage from phase C to phase A, $\vec{I}_{CA}$ is a vector value representative of the current from phase C to phase A at the source 200, $\vec{V}_B$ is a vector value of the voltage from phase B to neutral, $\vec{I}_{BN}$ is a vector value representative of the current from phase B to neutral connection (center tap of the winding 32) at the source 200, $\vec{V}_A$ is a vector value of the voltage from phase A to neutral, and $\vec{I}_{AN}$ is a vector value representative of the current from phase A to neutral at the source 200.

The values $V_{BC}$, $V_{CA}$, $V_A$, and $V_B$ are readily available within the meter 10 using the values $V_A(s)$, $V_B(s)$, $V_C(s)$. Thus, the voltage vector magnitudes $|\vec{V}_{BC}|$, $|\vec{V}_{CA}|$, $|\vec{V}_B|$, $|\vec{V}_A|$ may readily be determined in any suitable manner based on the digital measurement signals $V_A(s)$, $V_B(s)$, and $V_C(s)$ received from the ADC circuit 114.

For example, the processing circuit 116 receives $V_A(s)$ and $V_B(s)$ samples and may calculate the root-mean-squares of those samples over time to arrive at $|\vec{V}_A|$ and $|\vec{V}_B|$, respectively. Moreover the processing circuit 116 may generate $V_{BC}(s)$ and $V_{CA}(s)$ samples based on the available $V_A(s)$, $V_B(s)$, and $V_C(s)$ samples and perform root mean square calculations on them. For example, the samples values $V_{BC}(s)$ and $V_{CA}(s)$ may be generated from contemporaneous samples of the available digital voltage signals using the following relationships:

$$V_{BC}(s) = V_C(s) - V_B(s) \quad (11)$$

$$V_{CA}(s) = V_A(s) - V_C(s) \quad (12)$$

The root-mean-squares of the samples $V_{BC}(s)$ and $V_{CA}(s)$ over time yield $|\vec{V}_{BC}|$ and $|\vec{V}_{CA}|$, respectively. In this manner, the values $|\vec{V}_{BC}|$, $|\vec{V}_{CA}|$, $|\vec{V}_B|$, $|\vec{V}_A|$ of equation (10) can be generated from existing measurements.

The determination of the magnitude of the current vectors $\vec{I}_{BC}$, $\vec{I}_{CA}$, $\vec{I}_{BN}$, and $\vec{I}_{AN}$ cannot be performed by simple measurement and sampling of the corresponding currents. As discussed above, the meter 10 does not measure directly the currents on the secondary windings (legs) of the transformer arrangement 28, and thus does not have direct samples of source leg currents $I_{BC}$, $I_{CA}$, $I_{NB}$ and $I_{AN}$. However, it has been determined that the following relationships can be used to generate samples of $I_{BC}$, $I_{CA}$, $I_{NB}$ and $I_{AN}$ from contemporaneous samples $I_A(s)$, $I_B(s)$, $I_C(s)$, and $I_N(s)$ of the available current signals:

$$\vec{I}_{BC}(s) = \frac{KI_A(s) - KI_B(s) + (K+1)I_C(s)}{2(K+1)}. \quad (13)$$

$$\vec{I}_{CA}(s) = \frac{KI_A(s) - KI_B(s) - (K+1)I_C(s)}{2(K+1)}. \quad (14)$$

$$\vec{I}_{NB}(s) = \frac{KI_A(s) + (K+2)I_B(s) + (K+1)I_C(s)}{2(K+1)}. \quad (15)$$

$$\vec{I}_{AN}(s) = -\frac{(K+2)I_A(s) - KI_B(s) + (K+1)I_C(s)}{2(K+1)}. \quad (16)$$

The root-mean-square of the samples generated in equations (13)-(16) yields the magnitude values $|\vec{I}_{BC}|$, $|\vec{I}_{CA}|$, $|\vec{I}_{NB}|$, $|\vec{I}_{AN}|$ of equation (10).

In the equations above, the value K is a measure of the difference in impedance between the leg AB 204 of the source 200, and the legs BC 206 and CA 208 of the source 200. Referring again to FIG. 2, the impedance of the leg CA 208 (e.g. secondary winding 30 of FIG. 1) is modeled as $Z_{ca}$, the impedance of the leg BC 206 (e.g. secondary winding 34) is modeled as $Z_{bc}$, and the impedance of the leg AB 204 (e.g. secondary winding 32) is modeled as the two halves $Z_{an}$ and $Z_{nb}$ from node A to the center-tap N and node B to the center-tap N, respectively. The value of K is the ratio of the impedance $Z_{an}/Z_{ca}$. In the typical case $Z_{an}=Z_{nb}$ and $Z_{ca}=Z_{bc}$. Accordingly, the value of K is also equal to the ratios $Z_{an}/Z_{bc}$, $Z_{nb}/Z_{ca}$, and $Z_{nb}/Z_{bc}$. Any of such values may be used as K.

Figure 3A:
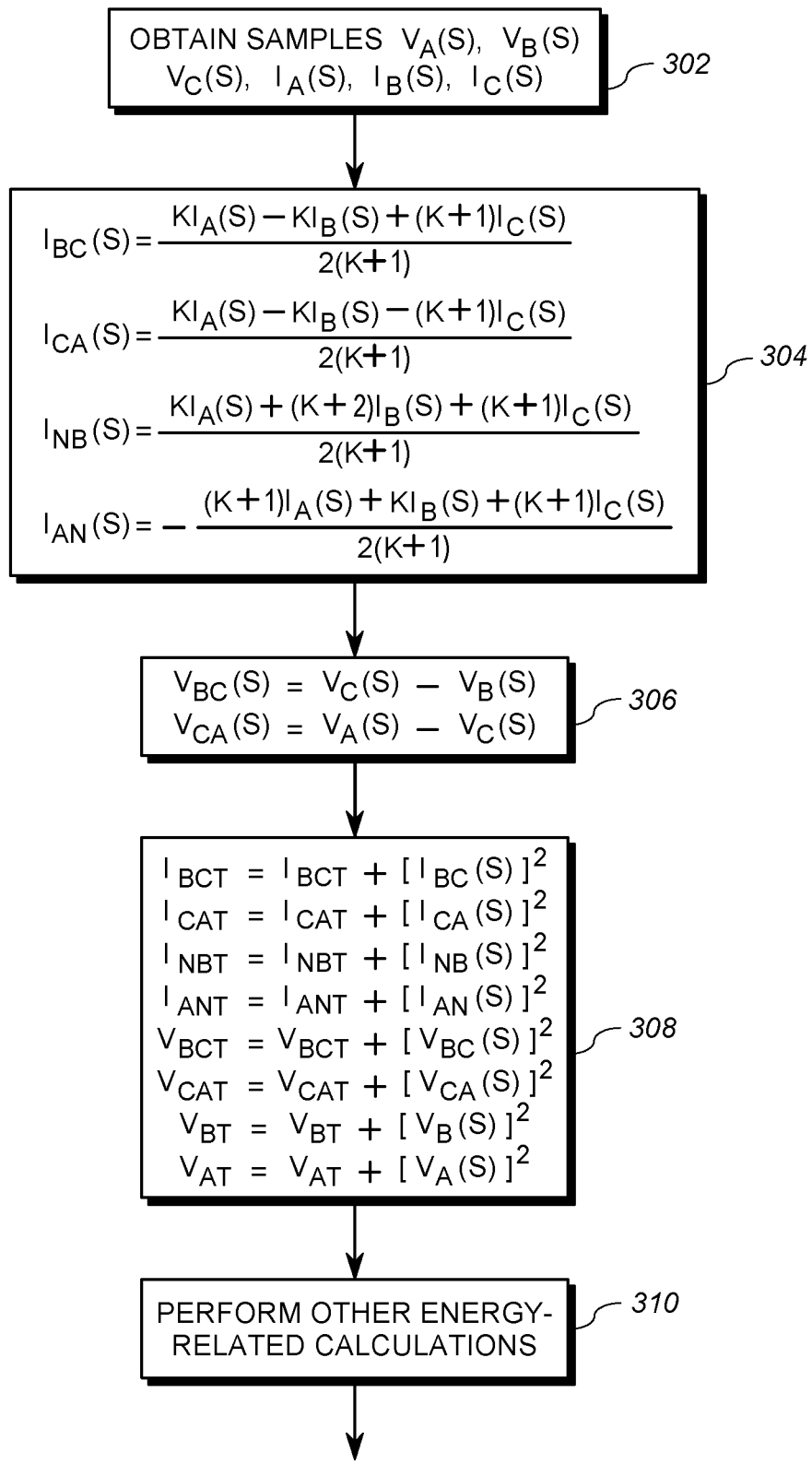
FIGS. 3A-3C show a flow diagram of the operation of a processing circuit of an arrangement for calculating VA in accordance with at least one embodiment of the present invention.
Figure 3B:
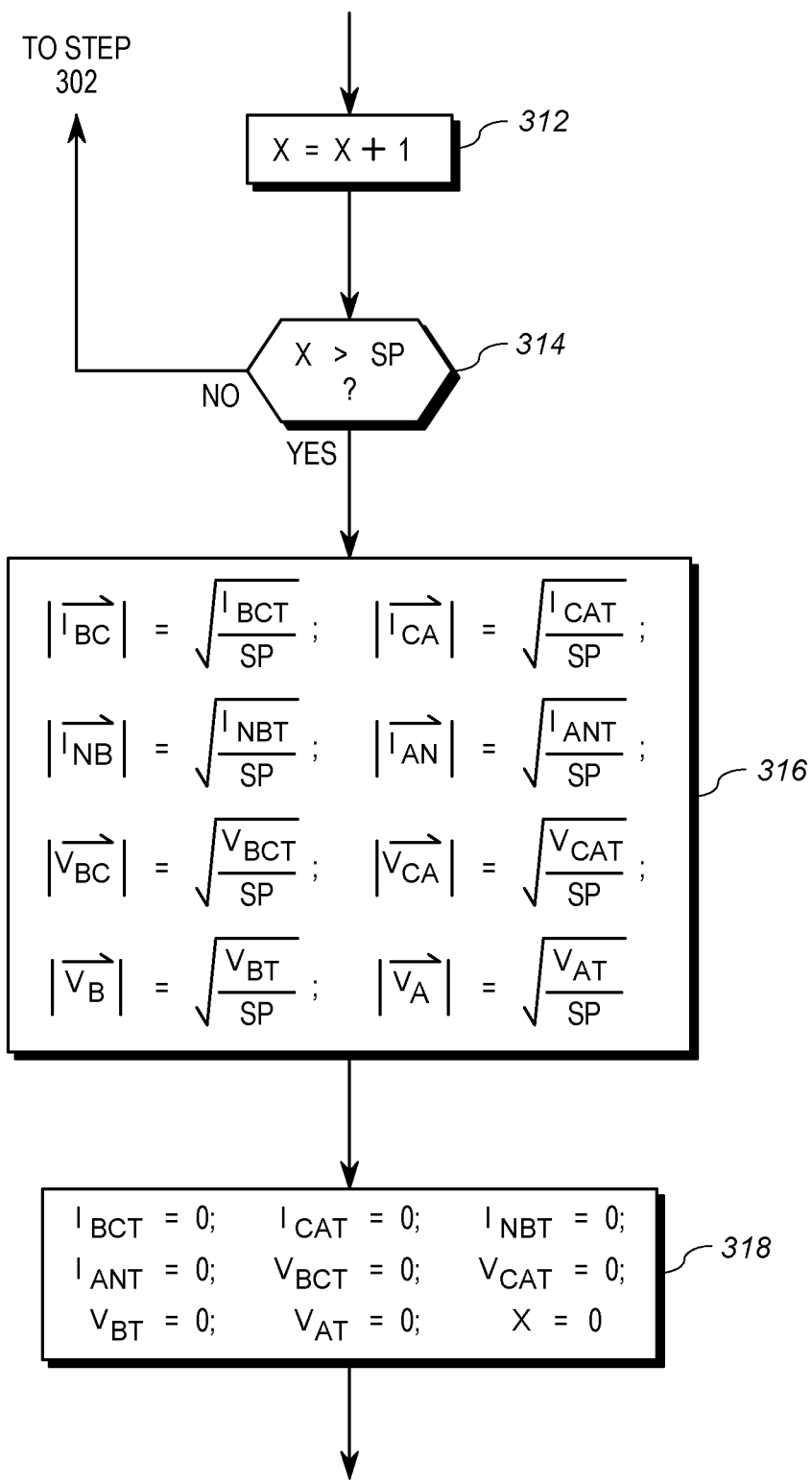
Figure 3C:
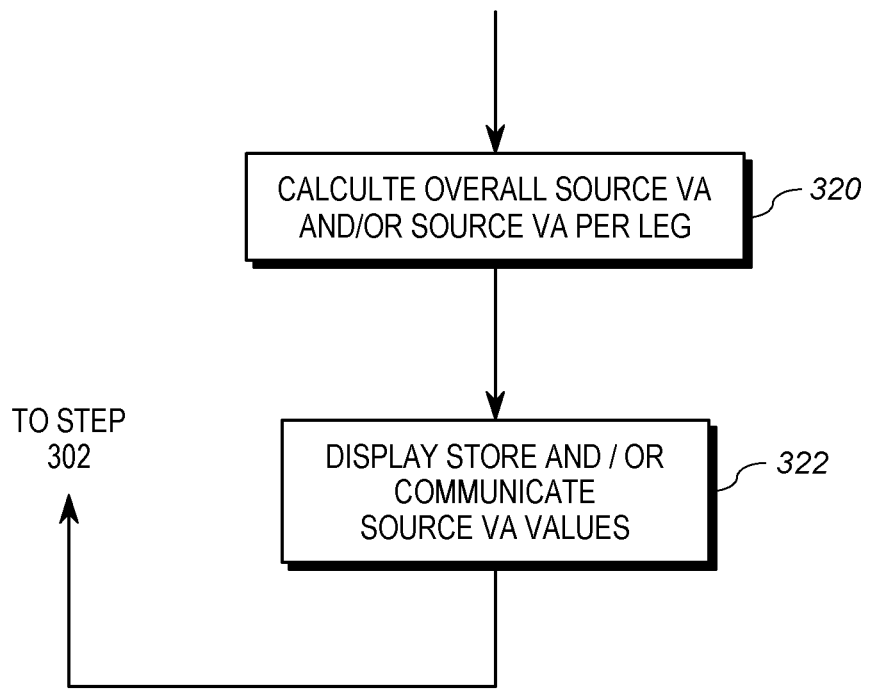

FIGS. 3A-3C show an exemplary set of operations of the processing circuit 116 of the meter 10 including those that determine SVA per equation (10), using the values of equations (13)-(16) for generating the magnitude of the source currents current values $\vec{I}_{CB}$, $\vec{I}_{CA}$, $\vec{I}_{BN}$, and $\vec{I}_{AN}$. The operations of FIG. 3A-3C further show, in context, the processing of samples that may be used to generate other metering values. As noted above, the processing circuit 116 preferably generates multiple metering values, such as watt-hr, VAR-hr, RMS voltage, RMS current, as well as the VA calculations using the same sample values $V_A(s)$, $V_B(s)$, $V_C(s)$, $I_A(s)$, $I_B(s)$, and $I_C(s)$.

Referring now to FIG. 3A, in step 302, the processing circuit 116 obtains contemporaneous samples $V_A(s)$, $V_B(s)$, $V_C(s)$, $I_A(s)$, $I_B(s)$, $I_C(s)$ for a sample time s. The contemporaneous samples do not need to be strictly simultaneous, but substantially contemporaneous with respect to the AC cycle and significant harmonics thereto. To this end, the processing circuit 116 obtains samples of the $V_A(s)$, $V_B(s)$, $V_C(s)$, $I_A(s)$, $I_B(s)$ and $I_C(s)$ from the ADC circuit 114. The processing circuit 116 then proceeds to step 304. In step 304, the processing circuit 116 generates source current samples $I_{BC}(s)$, $I_{CA}(s)$, $I_{NB}(s)$ and $I_{AN}(s)$ for the sample time s based on the equations (13)-(16), discussed further above.

It will be appreciated that the value K in equations (13)-(16) or information from which the value K may be calculated, is stored in the data store 112. In one embodiment, the actual impedances of the transformer arrangement 28 may be stored in the data store 112. In such a case, the processing circuit 116 determines K based on any of the impedance ratios $Z_{an}/Z_{ca}$, $Z_{an}/Z_{bc}$, $Z_{nb}/Z_{ca}$, or $Z_{nb}/Z_{bc}$, as discussed further above. In another embodiment, ratio K is derived from VA-ratings and so-called "% impedance" of the legs 204, 206 and 208 of the source transformer arrangement 200. The "% impedance" of a transformer (e.g. leg 204) is the percentage by which the voltage across the transformer (e.g. leg 204) drops at full load current due to the transformer's impedance. The "full load current" is based on the VA-rating of the transformer leg. Accordingly, technicians from the utility service provider may suitably store the VA-ratings and % impedance values of the legs 204, 206 and 208 of source transformer arrangement 200 (e.g. transformer arrangement 28) using an external computing device, such as the computing device 60. The technician may perform this operation upon installation of the meter 10 (or upon installation of the transformer), as the VA-rating and % impedance of the source transformer legs 204, 206 and 208 are typically available on a label or plate on the source transformer. Using VA-ratings and % impedance values the value K may be determined using the following:

$$K = \frac{Z_{an}}{Z_{ca}} = \left(\frac{1/2(\text{VA\_RAT\_CA})}{\text{VA\_RAT\_AB}}\right)\left(\frac{\%\ ZAB}{\%\ ZCA}\right) \quad (17)$$

which should be equivalent to $$K = \left(\frac{1/2(\text{VA\_RAT\_BC})}{\text{VA\_RAT\_AB}}\right)\left(\frac{\%\ ZAB}{\%\ ZBC}\right) \quad (18)$$

where VA_RAT_CA is the VA rating of the leg CA 208 of the source transformer arrangement 200, VA_RAT_BC is the VA rating of the leg BC 206, VA_RAT_AB is the VA rating of the leg AB 204, and where % ZAB, % ZBC and % ZCA are the % impedance values for, respectively, the legs 204, 206 and 208. The processing circuit 116 may calculate K using equations (17) or (18) as part of step 304. However, because the VA ratings do not change, the processing circuit 116 may suitably calculate K upon a power-up operation of the meter 10, and store the value K in the data store 112 separately. Thus, in step 304, the processing circuit 116 may obtain the value K directly from the data store 112, or derive it from impedance or VA ratings stored in the data store 112. As discussed above, the data store 112 may suitably be a combination of memory elements or devices within the meter housing 113.

It will be appreciated, however, that still other methods of obtaining the ratio of the impedances of the various transformer legs may be employed.

Referring again specifically to FIG. 3A, in step 306, the processing circuit 116 further generates the contemporaneous samples of the $V_{BC}$ and $V_{CA}$ using the equations (11) and (12), discussed further above.

Thereafter, the processing circuit 116 proceeds to step 308. In step 308, the processing circuit 116 squares each of the values generated in steps 304 and 306, as well as $V_B(s)$ and $V_A(s)$, and adds the resulting squared value of to an ongoing accumulation of corresponding values, $I_{BCT}$, $I_{CAT}$, $I_{NBT}$, $I_{ANT}$, $V_{BCT}$, $V_{CAT}$, $V_{BT}$, $V_{AT}$. In other words, the processing circuit performs the following operations:

$$I_{BCT} = I_{BCT} + [I_{BC}(s)]^2 \quad (19)$$

$$I_{CAT} = I_{CAT} + [I_{CA}(s)]^2 \quad (20)$$

$$I_{NBT} = I_{NBT} + [I_{NB}(s)]^2 \quad (21)$$

$$I_{ANT} = I_{ANT} + [I_{AN}(s)]^2 \quad (22)$$

$$V_{BCT} = V_{BCT} + [V_{BC}(s)]^2 \quad (23)$$

$$V_{CAT} = V_{CAT} + [V_{CA}(s)]^2 \quad (24)$$

$$V_{BT} = V_{BT} + [V_B(s)]^2 \quad (25)$$

$$V_{AT} = V_{AT} + [V_A(s)]^2 \quad (26)$$

Thereafter, in step 310, the processing circuit 116 makes further calculations for the purposes of generating (i.e. updating) other energy consumption values, such as those representative of watts, watt-hours, RMS current, RMS voltage and the like. The calculation of such values based on the ongoing sample stream of $V_A(s)$, $V_B(s)$, $V_C(s)$, $I_A(s)$, $I_B(s)$, $I_C(s)$ is known in the art and may take different formats. The processing circuit 116 may also calculate load VA or vector VA as discussed further above.

Thereafter, in step 312, the processing circuit 116 increments a counter x. The counter x is used to determine whether to actually perform the next SVA calculation, as will be discussed below. In particular, it is useful to have samples from multiple cycles of the AC waveform before calculating the SVA value. After step 312, the processing circuit 116 proceeds to step 314.

In step 314, the processing circuit 116 determines whether x is greater than a sample threshold sp. If not, then the processing circuit 116 returns to step 302 and awaits the next set of samples $V_A(s)$, $V_B(s)$, $V_C(s)$, $I_A(s)$, $I_B(s)$, $I_C(s)$, wherein s has been incremented for the next sampling period of the ADC 114. In this embodiment, the value of sp is 504, and the sampling rate (s/sec) is 2520, which produces a measurement period of 200 ms.

If, however, the processing circuit 116 determines that x is greater than a sample threshold sp, then the processing circuit 116 proceeds to step 316 to begin the source VA calculation. Specifically, in step 316, the processing circuit 116 generates the following vector magnitude values:

$$|\vec{I_{BC}}| = \sqrt{\frac{I_{BCT}}{sp}} \quad (27)$$

$$|\vec{I_{CA}}| = \sqrt{\frac{I_{CAT}}{sp}} \quad (28)$$

$$|\vec{I_{NB}}| = \sqrt{\frac{I_{NBT}}{sp}} \quad (29)$$

$$|\vec{I_{AN}}| = \sqrt{\frac{I_{ANT}}{sp}} \quad (30)$$

$$|\vec{V_{BC}}| = \sqrt{\frac{V_{BCT}}{sp}} \quad (31)$$

$$|\vec{V_{CA}}| = \sqrt{\frac{V_{CAT}}{sp}} \quad (32)$$

$$|\vec{V_B}| = \sqrt{\frac{V_{BT}}{sp}} \quad (33)$$

$$|\vec{V_A}| = \sqrt{\frac{V_{AT}}{sp}} \quad (34)$$

After step 316, the processing circuit 116 proceeds to step 318.

In step 318, the processing circuit 116 resets the counter x to zero, and also resets the values $I_{BCT}$, $L_{CAT}$, $I_{NBT}$, $I_{ANT}$, $V_{BCT}$, $V_{CAT}$, $V_{BT}$, $V_{AT}$ to zero. The processing circuit 116 thereafter proceeds to step 320. In step 320, the processing circuit 116 performs the calculation of equation (10) based on the values generated in step 316. In other words the processing circuit 116 generates SVA as follows:

$$SVA = VA = |\vec{V_{BC}}|*|\vec{I_{BC}}| + |\vec{V_{CA}}|*|\vec{I_{CA}}| + |\vec{V_B}|*|\vec{I_{NB}}| + |\vec{V_A}|*|\vec{I_{AN}}| \quad (10)$$

In some embodiments, the processing circuit 116 also (or in the alternative) calculates source VA separately for each leg 204, 206 and 208 of the transformer arrangement 200. To this end, the processing circuit 116 may make the following calculations:

$$SVA_{AB} = |\vec{V_B}|*|\vec{I_{NB}}| + |\vec{V_A}|*|\vec{I_{AN}}| \quad (35)$$

$$SVA_{BC} = |\vec{V_{BC}}|*|\vec{I_{BC}}| \quad (36)$$

$$SVA_{CA} = |\vec{V_{CA}}|*|\vec{I_{CA}}| \quad (37)$$

In this manner, information is collected regarding each individual leg of the source transformer 200, which can be used to determine if a particular leg is undersized, even if the overall source VA is within reasonable limits of the total of the three legs. It will be appreciated that the processing circuit 116 may be configured to only determine the source VA of a single leg of the transformer, e.g. using only one of the equations (35), (36) and (37). Indeed, since the load is typically balanced on the BC and CA legs, it may only be necessary to perform the source VA calculations for $SVA_{AB}$ and one of $SVA_{CA}$ or $SVA_{BC}$. If the source VA is determined for fewer than all the legs, then the corresponding calculations of steps 304, 306, 308 and 316 may be reduced to only those necessary for the source VA values that are determined.

In any event, in step 322, the processing circuit 116 stores, displays or otherwise communicates the determined source VA value(s) determined in step 320, for example, the SVA value from equation (10) and/or any of the values $SVA_{AB}$, SVA$_{BC}$, and SVA$_{CA}$ from equations (35)-(37). In particular, the processing circuit 116 may suitably store the source VA value(s) in the data store 112, display the source VA value(s) using the display 120, and/or communicate the source VA value(s) to a remote device, such as an external computer 60, using the communication circuit 118. The external computer 60 can be used to monitor the source VA values to determine if any of the values exceed the corresponding VA ratings for the transformer arrangement 200 (and/or any leg thereof) by an amount and for a duration that would indicate the need for replacing the subject transformer or transformer leg with a resized unit.

In some embodiments, instead of transmitting, storing or displaying all source VA ratings, the processing circuit 116 in step 322 may only store, display or transmit source VA ratings if they exceed a threshold. For example, step 322 can include identifying whether one or more of the source VA values SVA, SVA$_{AB}$, SVA$_{BC}$, and/or SVA$_{CA}$ exceeds a corresponding threshold stored in the data store 112. The threshold for each leg 204, 206 and 208 may suitably be derived from the VA rating information entered into the data stored 112 by the technician. For example, in step 322, the processing circuit 116 can determine if any of the source VA values calculated in step 320 exceed a corresponding stored VA rating by a predetermined percentage. The processing circuit 116 may then store, display or transmit alarm information based on the determination that any of the legs 204, 206 or 208 (or the entire arrangement 200) exceeds their corresponding VA rating by the predetermined percentage. The alarm information can, for example, include the source VA measurement itself, other source VA measurements (for other legs of the transformer arrangement 200) and a time and date stamp.

In this manner, an early warning of an undersized transformer 200 or transformer leg 204, 206 or 208 can be communicated to the utility (e.g. via external computing device 60). This allows the utility to become aware of a possibly undersized transformer leg for a customer load, so that corrective action may be taken. It will be appreciated that the external computing device 60 is given as an illustration, and may actually constitute different external computing devices for performing the different tasks discussed herein. In other words, it is not the intention that the same computing device perform all of the tasks ascribed to the external computing device 60 described herein.

It will also be appreciated that the processing circuit 116 may employ the stored source VA value(s) for further calculations. For example, the processing circuit 116 may further filter each of the source VA values by averaging several consecutive values, such as five or ten of such values. In some embodiments, it is the average SVA value that is displayed or communicated, or compared to the predetermined threshold.

The processing circuit 116 may also accumulate the stored SVA values calculated over time, multiplied by the corresponding time periods, to generate a source VA-hr value. The processing circuit 116 may also store in the memory 116 an SVA value for each of a plurality of time periods in conjunction with a time-of-use and/or load profiling metering function. In such a case, the processing circuit 116 stores either an average SVA (VA), or an accumulated SVA (VAh), for each time period of a set of time periods for each day.

In any event, after step 322, the processing circuit 116 returns to step 302 and proceeds accordingly.

It will be appreciated that the embodiment described above may readily be adapted to calculate source VA for a three-wire delta electrical service. A three-wire delta service is similar to a four-wire delta service except that no separate neutral line is provided. Instead, the phase B line 214 is used as the neutral line.

To adapt the calculations discussed above for three-wire delta, the processing circuit 116 can use equation (10) set forth above, and any of the sets of equations discussed above, wherein I$_B$ is set to $-I_A - I_C$ (e.g. $I_B(s) = -I_A(s) - I_C(s)$) and $I_N = 0$. While a suitable method for calculating source VA in a three-wire delta system is disclosed in U.S. Pat. No. 7,747,400, the embodiment described herein allows for the same general sets of equations to be used for both three-wire delta and four-wire delta systems, with only two extra (and simple) operations added. As a result, the meter 10 can be readily made adaptable to both systems with effectively one set of equations.

It will be appreciated that the processing circuit 116 of the meter 10 may also provide load VA as well as any other energy consumption-related values to the display 120 or to the communication circuit 118 for transmission to an external device. In some cases, the processing circuit 116 provides the VA information to a billing calculation unit (such as a billing formula implemented by the processing circuit itself) so that billing calculations may be made, for example, in a conventional manner.

The methods described above cover services with transformers (e.g. at source 200) having equal or different VA ratings. The example described above specifically addresses the common case where two legs of the 4 wire delta transformer have the same impedance or VA rating, and the center tap leg of the transformer has a different rating.

It will be appreciated that the above described embodiments are merely illustrative, and that those of ordinary skill in the art may readily devise their own modifications and implementations that incorporate the principles of the present invention and fall within the spirit and scope thereof.

I claim:

1. An arrangement for measuring VA loading on a transformer in a delta-wired electrical service, comprising:
    a) a meter housing;
    b) a sensor circuit disposed within the meter housing, the sensor circuit configured to be electrically connected to receive voltage and current provided to a load from a secondary side of one or more source transformers arranged in a delta-wired electrical service having phase A, phase B and phase C lines, the one or more source transformers including at least one center-tap secondary winding, the sensor circuit configured to generate voltage measurement signals and current measurement signals representative of the received voltage and current;
    c) an A/D converter disposed within the meter housing, the A/D converter configured to receive the voltage measurement signals and generate therefrom contemporaneous samples of V$_A$, V$_B$, V$_C$, and to receive the current measurement signals and generate therefrom at least three of I$_A$, I$_B$, I$_C$, and I$_N$, where I$_A$ is a current measurement signal of phase A, I$_B$ is a current measurement signal of phase B, I$_C$ is a current measurement signal of phase C, I$_N$ is a current measurement signal of a neutral connection, V$_A$ is a voltage measurement signal from phase A to neutral, V$_B$ is a voltage measurement signal from phase B to neutral, and V$_C$ is a voltage measurement signal from phase C to neutral;
    d) a processing circuit operably coupled to the A/D converter, the processing circuit configured to:
        i) obtain a value indicative of a ratio K of a first impedance of one leg of the at least one center-tap secondary winding to a second impedance of a different secondary winding;

ii) determine at least one of an $I_{BC}$ sample value, an $I_{CA}$ sample value, an $I_{NB}$ sample value, and an $I_{AN}$ sample value, based on K and contemporaneous samples of at least three of $I_A$, $I_B$, $I_C$, and $I_N$;

iii) determine a VA value corresponding to at least one secondary winding of the at least one source transformer based at least in part on the at least one sample value determined in ii); and iv) provide information representative of the VA value to one of a group consisting of a display, a communication circuit, a memory and a billing calculation unit.

2. The arrangement of claim 1, wherein the processing circuit is further configured to:

a) generate a plurality of at least one of the $I_{BC}$, $I_{CA}$, $I_{NB}$ and $I_{AN}$ sample values; and b) generate a magnitude value for the plurality of the at least one of the $I_{BC}$, $I_{CA}$, $I_{NB}$ and $I_{AN}$ sample values.

3. The arrangement of claim 2, wherein the processing circuit is further configured to determine the VA value further based at least in part on the generated magnitude value.

4. The arrangement of claim 3, wherein the processing circuit is further configured to determine the VA value further based in part on a magnitude of a voltage from phase A to neutral and a magnitude of a voltage from phase B to neutral.

5. The arrangement of claim 4, wherein the processing circuit is further configured to determine the magnitude of the voltage from phase A to neutral and determine the magnitude of the voltage from phase B to neutral using a root-mean-square calculation.

6. The arrangement of claim 4, wherein the processing circuit is further configured to generate the VA value based on the equation:

$$VA = |\vec{V}_B| * |\vec{I}_{NB}| + |\vec{V}_A| * |\vec{I}_{AN}|$$

wherein $|\vec{V}_B|$ is a magnitude of the voltage from phase B to neutral, $|\vec{I}_{BN}|$ is the $I_{NB}$ magnitude value representative of the current from phase A to neutral, $|\vec{V}_A|$ is a magnitude of the voltage from phase A to neutral, and $|\vec{I}_{AN}|$ is a magnitude value representative of the current from phase A to neutral.

7. The arrangement of claim 1, further comprising the display, and wherein the display is configured to display the information representative of the VA calculation.

8. The arrangement of claim 1, wherein the at least one transformer is disposed external to the meter housing.

9. An electricity meter arrangement for measuring VA loading on a transformer in a delta-wired electrical service, comprising:

a) a meter housing;

b) a sensor circuit disposed within the meter housing, the sensor circuit configured to be electrically connected to receive voltage and current provided to a load from a secondary side of one or more source transformers arranged in a delta-wired electrical service having phase A, phase B and phase C lines, the one or more source transformers including at least one center-tap secondary winding, the sensor circuit configured to generate voltage measurement signals and current measurement signals representative of the received voltage and current;

c) an A/D converter disposed within the meter housing, the A/D converter configured to receive the voltage measurement signals and generate therefrom samples of $V_A$, $V_B$, $V_C$, and to receive the current measurement signals and generate therefrom at least three samples of $I_A$, $I_B$, $I_C$, and $I_N$, where $I_A$ is a current measurement signal of phase A, $I_B$ is a current measurement signal of phase B, $I_C$ is a current measurement signal of phase C, $I_N$ is a current measurement signal of a neutral connection, $V_A$ is a voltage measurement signal from phase A to neutral, $V_B$ is a voltage measurement signal from phase B to neutral, and $V_C$ is a voltage measurement signal from phase C to neutral;

d) a processing circuit within the meter housing, the processing circuit operably coupled to the A/D converter, the processing circuit configured to:

i) obtain a value indicative of a ratio K of a first impedance of one leg of the at least one center-tap secondary winding to a second impedance of a different secondary winding;

ii) determine an $I_{BC}$ sample value based on K and contemporaneous samples of at least three of $I_A$, $I_B$, $I_C$, and $I_N$;

iii) determine an $I_{CA}$ sample value based on K and contemporaneous samples of at least three of $I_A$, $I_B$, $I_C$, and $I_N$;

iv) determine an $I_{NB}$ sample value based on K and contemporaneous samples of at least three of $I_A$, $I_B$, $I_C$, and $I_N$;

v) determine an $I_{AN}$ sample value based on K and contemporaneous samples of at least three of $I_A$, $I_B$, $I_C$, and $I_N$;

vi) determine a VA value corresponding to the secondary windings of the at least one transformer based at least in part on the $I_{BC}$, $I_{CA}$, $I_{NB}$ and $I_{AN}$ sample values;

vii) provide information representative of the VA value to one of a group consisting of a display, a communication circuit, a memory and a billing calculation unit;

viii) determine a real energy consumption value by a load based at least in part on samples of $V_A$, $V_B$, $V_C$, and samples of $I_A$, $I_B$, $I_C$.

vi) provide information representative of the real energy consumption value to one of a group consisting of a display, a communication circuit, a memory and a billing calculation unit.

10. The electricity meter arrangement of claim 9, further comprising the communication circuit, and wherein; the communication circuit is supported by the meter housing; and the processing circuit is further configured to cause the communication circuit to transmit the information representative of the VA value to a computing device external to the meter housing.

11. The electricity meter arrangement of claim 10, further comprising the computing device, and wherein the computing device is configured to communicate with the communication circuit via an optical connector.

12. The electricity meter arrangement of claim 10, wherein the computing device is disposed remote from the meter housing, and wherein the communication circuit is configured to transmit the VA value using a communication network.

13. The electricity meter arrangement of claim 10, wherein the at least one transformer is disposed external to the meter housing.

14. The arrangement of claim 9, wherein the processing circuit is further configured to:
  a) generate a plurality of each of the $I_{BC}$, $I_{CA}$, $I_{NB}$ and $I_{AN}$ sample values; and
  b) generate a magnitude value for each of the plurality of the $I_{BC}$, $I_{CA}$, $I_{NB}$ and $I_{AN}$ sample values.

15. The arrangement of claim 14, wherein the processing circuit is further configured to determine the VA value further based at least in part on the $I_{BC}$ magnitude value, the $I_{CA}$ magnitude value, the $I_{NB}$ magnitude value, and the $I_{AN}$ magnitude value.

16. The arrangement of claim 15, wherein the processing circuit is further configured to determine the VA value further based in part on a magnitude of a voltage difference from phase C to phase B and a magnitude of a voltage difference from phase C to phase A.

17. The arrangement of claim 16, wherein the processing circuit is further configured to determine the magnitude of the voltage from phase C to phase B and determine the magnitude of the voltage from phase C to phase A by:
  a) generating a plurality of the $V_{BC}$ sample values, each $V_{BC}$ sample value comprising a difference between a phase C sample and a contemporaneous phase B sample; and
  b) generating a $V_{BC}$ magnitude value using the plurality of the $V_{BC}$ sample values;
  c) generating a plurality of the $V_{CA}$ sample values, each $V_{CA}$ sample value comprising a difference between a phase C sample and a contemporaneous phase A sample;
  d) generating a $V_{CA}$ magnitude value using the plurality of the $V_{CA}$ sample values.

18. The arrangement of claim 16, wherein the processing circuit is further configured to generate the VA value based on the equation:

$$VA = |\vec{V}_{CB}| * |\vec{I}_{CB}| + |\vec{V}_{CA}| * |\vec{I}_{CA}| + |\vec{V}_{B}| * |\vec{I}_{BN}| + |\vec{V}_{A}| * |\vec{I}_{AN}|$$

wherein $|\vec{V}_{CB}|$ is the $V_{BC}$ magnitude value, $|\vec{I}_{CB}|$ is the $I_{BC}$ magnitude value, $|\vec{V}_{CA}|$ is the $V_{CA}$ magnitude value, $|\vec{I}_{CA}|$ is the $I_{CA}$ magnitude value, $|\vec{V}_{B}|$ is a magnitude of the voltage from phase B to neutral, $|\vec{I}_{BN}|$ is the $I_{NB}$ magnitude value, $|\vec{V}_{A}|$ is a magnitude of the voltage from phase A to neutral, and $|\vec{I}_{AN}|$ is a vector value representative of the current from phase A to neutral.

* * * * *